United States Patent
Tsumura et al.

(10) Patent No.: US 7,115,999 B2
(45) Date of Patent: Oct. 3, 2006

(54) SEMICONDUCTOR DEVICE AND METHOD OF MANUFACTURING THE SAME

(75) Inventors: Kazumichi Tsumura, Kawasaki (JP); Hideki Shibata, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 50 days.

(21) Appl. No.: 10/833,043

(22) Filed: Apr. 28, 2004

(65) Prior Publication Data

US 2005/0093168 A1 May 5, 2005

(30) Foreign Application Priority Data

Oct. 30, 2003 (JP) ............... 2003-371005

(51) Int. Cl.
*H01L 23/12* (2006.01)

(52) U.S. Cl. .............. 257/774; 257/775; 438/629; 438/638

(58) Field of Classification Search ............... None
See application file for complete search history.

(56) References Cited

U.S. PATENT DOCUMENTS

| | | | | |
|---|---|---|---|---|
| 5,976,975 A | * | 11/1999 | Joshi et al. ............ | 438/672 |
| 6,319,831 B1 | | 11/2001 | Tsai et al. | |
| 6,482,656 B1 | * | 11/2002 | Lopatin .................. | 438/2 |
| 6,872,659 B1 | * | 3/2005 | Sinha ..................... | 438/678 |
| 6,888,245 B1 | * | 5/2005 | Tsukamoto ............. | 257/751 |
| 2003/0170954 A1 | * | 9/2003 | Rudeck .................. | 438/266 |

FOREIGN PATENT DOCUMENTS

| | | |
|---|---|---|
| JP | 8-153690 | 6/1996 |
| JP | 11-135630 | 5/1999 |

* cited by examiner

*Primary Examiner*—Leonardo Andújar
(74) *Attorney, Agent, or Firm*—Oblon, Spivak, McClelland, Maier & Neustadt, P.C.

(57) ABSTRACT

A semiconductor device has an active element structure formed on a semiconductor substrate. The active element has a connection region formed on a surface of the semiconductor substrate. An insulating film is formed on the semiconductor substrate. A connection hole is formed in the insulating film, and has a bottom connected with the connection region. An interconnect trench is formed in the insulating film, and has a bottom connected with the connection region. A first conductive film is filled in a first region ranging from the connection region in the connection hole to a first height, and is composed of an alloy containing CoW or NiW. A second conductive film is formed in the interconnect trench, and is electrically connected with the first conductive film.

13 Claims, 5 Drawing Sheets

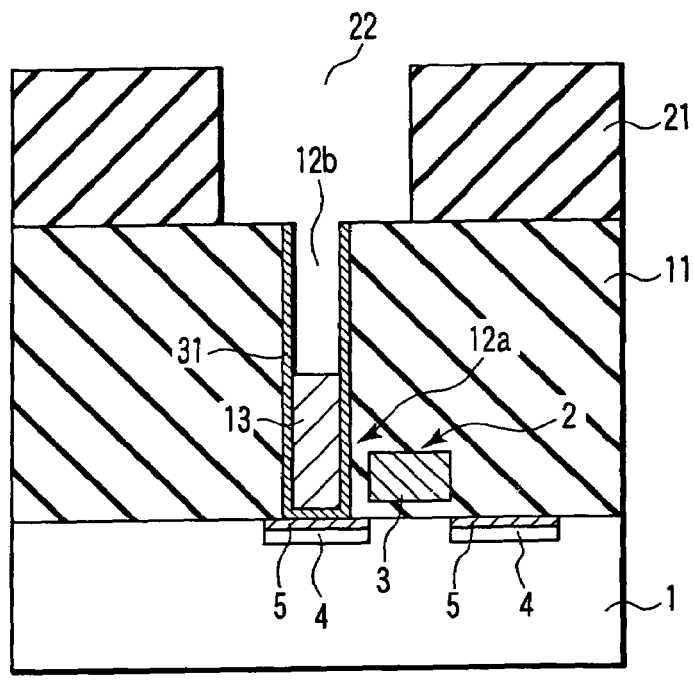
F I G. 13

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2003-371005, filed Oct. 30, 2003, the entire contents of which are incorporated herein by reference.

BACKGROUND OF THE INVENTION

1. Field of the Invention

The present invention relates to a semiconductor device. For example, the present invention relates to the structure of contacts connecting a transistor on a semiconductor substrate and an interconnect trench in an interlayer insulating film thereon.

2. Description of the Related Art

The conventional method of manufacturing contacts and interconnect (wiring) layers will be described below with reference to FIG. 14. First, a contact hole 103 is formed in an interlayer insulating film 102 on a semiconductor substrate 101. The contact hole 103 has a bottom portion reaching the semiconductor substrate 101. The contact hole 103 is filled with conductive materials via an adhesion layer 104 using a blanket CVD (chemical vapor deposition) process. The adhesion layer 104 has a function of providing preferable adhesion of materials filled in the contact hole 103 with the sidewall thereof when the CVD process is carried out. Extra conductive materials on the interlayer insulating film 102 are removed using CMP (chemical mechanical polishing), and thereby, a contact plug 105 is formed. An interlayer insulating film 107 having an interconnect trench 106 connected with the contact plug 105 is formed on the interlayer insulating film 102. Thereafter, the interconnect trench 106 is filled with a conductive film via a barrier metal 108.

Recently, with the scale-down of semiconductor devices, the aspect ratio of the contact hole 103 increases. For this reason, the following phenomena take place when the contact hole 103 is filled with conductive materials using blanket CVD. First, according to blanket CVD, the conductive material film uniformly grows from the side of the contact hole 103. For this reason, if the contact hole 103 has a defective shape (e.g., the diameter of hole opening is smaller than that of other portions), the opening of the contact hole 103 is closed before the contact hole 103 is filled. As a result, an empty space called a seam (void) 109 is formed in the contact hole 103. Secondary, if tungsten (W) is used as the material of the contact plug 105, the interface of W deposited from both sides of the contact hole 103 is formed with the empty space because W has a coarse surface.

The seam 109 is formed in the contact hole 103; as a result, the seam 109 opens as seen from FIG. 14 in the process of removing extra W by CMP or the RIE (reactive ion etching) process for forming the interconnect trench 106. Consequently, the barrier metal 108 is not continuously formed in the hole opening of the seam 109; for this reason, a broken portion is formed. If the interconnect trench 106 is filled with interconnect conductive film in a state that a broken portion is formed, the following problem arises. Electro-migration resistance is reduced on the basis of the broken portion; as a result, desired reliability is not obtained.

The adhesion layer 104 is employed when W is used as the material of the contact plug 105; in this case, the adhesion layer 104 has a specific resistance smaller than W. For this reason, when the diameter of the contact hole 103 become gradually small, the ratio of the adhesion layer 104 occupying the cross-sectional area of the contact hole 103 becomes high. As a result, the resistance of the contact plug 105 increases.

BRIEF SUMMARY OF THE INVENTION

According to a first aspect of the present invention, there is provided a semiconductor device comprising: a semiconductor substrate; an active element structure formed on the semiconductor substrate, and having a connection region formed in a surface of the semiconductor substrate; an insulating film formed on the semiconductor substrate; a connection hole formed in the insulating film, and having a bottom connected with the connection region; an interconnect trench formed in the insulating film, and having a bottom connected with the connection hole; a first conductive film filled in a first region ranging from the connection region in the connection hole to a first height, and consisting of an alloy containing CoW or NiW; and a second conductive film formed in the interconnect trench, and electrically connected with the first conductive film.

According to a second aspect of the present invention, there is provided a method of manufacturing a semiconductor device comprising: forming an active element structure having a connection region formed in a surface of a semiconductor substrate, on the semiconductor substrate; forming a first insulating film having a connection hole whose bottom is connected with the connection region, on the semiconductor substrate; filling the connection hole with a first conductive film composed of an alloy containing CoW or NiW by electroless plating; forming a second insulating film having an interconnect trench whose bottom is connected with the connection hole, on the first insulating film; and filling the interconnect trench with a second conductive film.

According to a third aspect of the present invention, there is provided a method of manufacturing a semiconductor device comprising: forming an active element structure having a connection region formed on a surface of a semiconductor substrate, on the semiconductor substrate; forming a first insulating film having a connection hole whose bottom is connected with the connection region, on the semiconductor substrate; filling a first region ranging from the connection region in the connection hole to a first height with a first conductive film composed of an alloy containing CoW or NiW by electroless plating; forming a second insulating film having an interconnect trench whose bottom is connected with the connection hole, on the first insulating film; and filling the interconnect trench and a second region excepting the first region of the connection hole with a second conductive film.

BRIEF DESCRIPTION OF THE SEVERAL VIEWS OF THE DRAWING

FIGS. 12 and 13 are views sequentially showing part of the process of manufacturing the semiconductor device shown in FIG. 11.

DETAILED DESCRIPTION OF THE INVENTION

Figure 1:
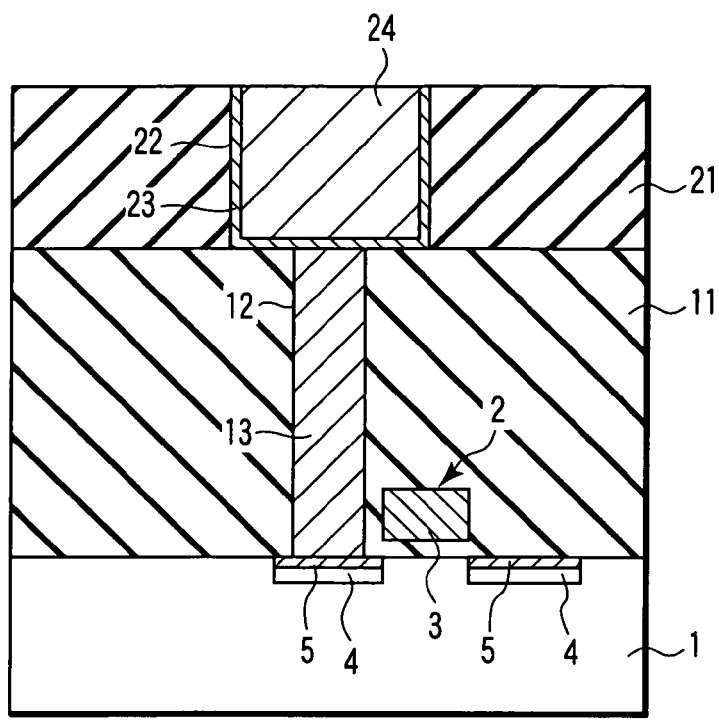
FIG. 1 is a view showing the cross-sectional structure of a semiconductor device according to a first embodiment of the present invention.

Embodiments of the present invention will be described below with reference to the accompanying drawings. In the following description, the same reference numerals are used to designate constituent components having an identical function and configuration. Any overlapping explanation will be made if necessary.

(First Embodiment)

FIG. 1 is a view showing the cross-sectional structure of a semiconductor device according to a first embodiment of the present invention. As shown in FIG. 1, the surface of a semiconductor substrate 1 is formed with a transistor 2. The transistor 2 has a gate electrode 3 and source/drain diffusion layers 4. The gate electrode 3 is formed on a gate insulating film (not shown) on the semiconductor substrate 1. The source/drain diffusion layers 4 are formed in the surface of the semiconductor substrate 1 so that the gate electrode 3 can be held between them. Each surface of the source/drain diffusion layers 4 is formed with a silicide 5.

An interlayer insulating film 11 is formed on the semiconductor substrate 1. A low-dielectric-constant film may be used as the material for the interlayer insulating film 11. This serves to soften signal delay by RC coupling between interconnects and plugs in the interlayer insulating film 11. Organic silicon film and organic film may be used as the low-dielectric-constant film. More specifically, fluorine-doped silicon oxide film, methylsiloxane and methylsilsesquioxane (MSQ) may be used as the organic silicon film. Poly-allylene ether may be used as the organic film. In addition, porous films may be used as the organic silicon film and organic film. The porous film is a film in which many pores are formed.

The interlayer insulating film 11 is formed with a contact hole 12 extending from the surface to the silicide 5. The contact hole 12 is filled with a first conductive film 13, and thereby, a contact plug is formed. An alloy of W and Co (cobalt) or Ni (nickel) may be used as the first conductive film 13. In addition, CoW and NiW alloys containing group III or V elements may be used as the first conductive film 13. More specifically, CoWP, CoWB, NiWP and NiWB are given. The first conductive film 13 is formed in a manner of upwardly growing from the bottom surface of the contact hole 12 by electroless plating, as described later.

An interlayer insulating film 21 is formed on the interlayer insulating film 11. The interlayer insulating film 21 is formed with an interconnect trench 22 extending from the surface to the contact hole 12. A barrier metal (diffusion prevention film) 23 is formed on the inner surface of the interconnect trench 22. In other words, the barrier metal 23 covers interlayer insulating films 11 and 21 in the interconnect trench and the upper surface of the first conductive film 13. The following material is used as the barrier metal 23. The material is capable of preventing molecules diffusion of interconnect layer material described later, that is, Cu (copper) or Al (aluminum) from diffusing to the interlayer insulating films 11 and 21. More specifically, Ta, TaN, TiSiN, TiN and WN are given. The interconnect layer is formed of a second conductive film 24 filled in the interconnect trench 22 via the barrier metal 23. Cu or Al may be used as the second conductive film 24.

One or more interlayer insulating film (not shown) may be formed on the interlayer insulating film 21. The interlayer insulating film may be formed with plugs and interconnect layers (neither are shown), if desired.

Figure 2:
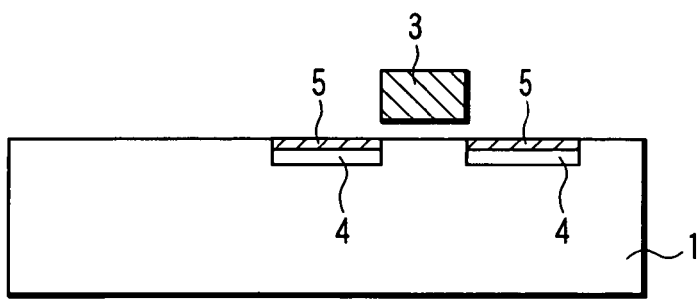
FIGS. 2, 3, and 4 are views sequentially showing part of the process of manufacturing the semiconductor device shown in FIG. 1.

The method of manufacturing the semiconductor device shown in FIG. 1 will be described below with reference to FIG. 2 to FIG. 4. According to a known method, the surface of the semiconductor substrate 1 is formed with the transistor 2, and the silicide 5 is formed on each of the source/drain diffusion layers 4, as shown in FIG. 2.

Figure 3:
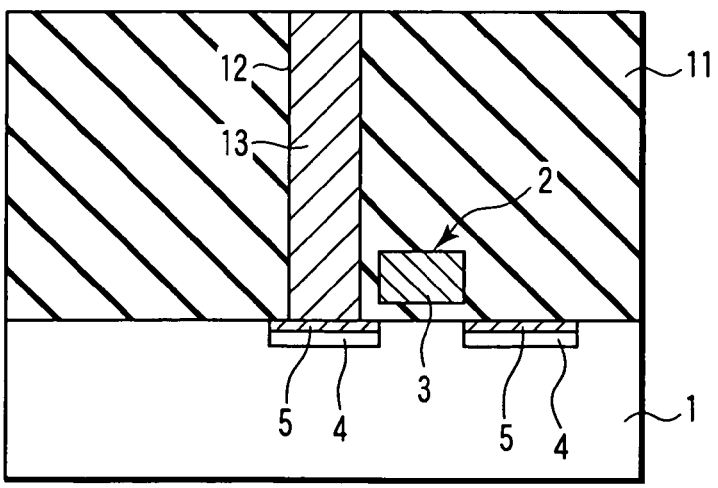

As illustrated in FIG. 3, the interlayer insulating film 11 is formed on the semiconductor substrate 1 by the CVD process. The contact hole 12 is formed in the interlayer insulating film 11 by lithography and etching such as RIE. The contact hole 12 is filled with the first conductive film 13 by electroless plating, and thereby, a contact plug is formed.

Figure 4:
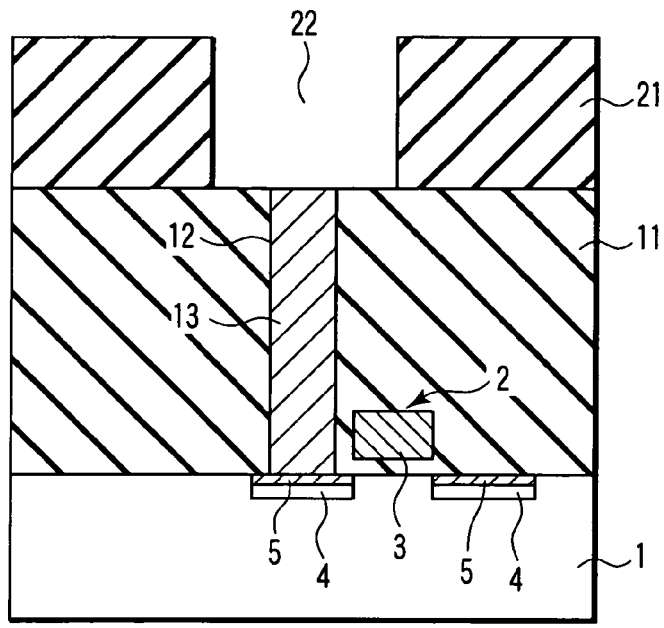

As depicted in FIG. 4, the interlayer insulating film 21 is formed on the interlayer insulating film 11 by the CVD process. The interconnect trench 22 is formed in the interlayer insulating film 21 by lithography and etching such as RIE.

As seen from FIG. 1, the barrier metal 23 is formed over the entirety of the inner surface of the interconnect trench 22 by sputtering. If copper is used as the material for the second conductive film 24 of the interconnect layer, a seed layer (not shown) consisting of copper is formed by sputtering. In this case, the seed layer is formed on the bottom surface of the interconnect trench 22 (on interlayer insulating film 11 and first conductive film 13). The interconnect trench 22 is filled with copper by electroplating using the seed layer. Thereafter, an interconnect insulating film, interconnect layer and contact plug (these are not shown) may be further formed, if desired.

According to the first embodiment of the present invention, the semiconductor device has the following structure. The contact plug contacting the semiconductor substrate 1 at the bottom surface is formed of the first conductive film 13 filled by electroless plating. The first conductive film 13 grows upwardly from the bottom surface of the contact hole 12, and thereby, the contact hole 12 is filled. Thus, no seam resulting from the film growth from both sides of the contact hole is formed in the first conductive film 13 forming the contact plug 12, unlike the case of the blanket CVD process. As a result, the barrier metal 23 in the interconnect trench 22 is prevented from being broken in the upper opening of the seam. Therefore, it is possible to prevent the reduction of electro-migration resistance of the semiconductor device.

According to the first embodiment, the first conductive film 13 is formed using electroless plating. Therefore, even if the aspect ratio of the contact hole 12 is high, the contact hole 12 is preferably filled. In particular, if the aspect ratio is 8 or more, the first embodiment is effective because it is difficult to preferably fill the contact hole according to the CVD process.

According to the first embodiment, the first conductive film 13 is formed using electroless plating. Therefore, there is no need of forming the adhesion layer on the inner surface of the contact hole 12. Consequently, it is possible to reduce the resistance value of the first conductive film 13 as compared with the case of forming the contact plug using the CVD process.

According to the first embodiment, the contact plug is formed in a manner that alloys composed of W and Co or Ni is grown using electroless plating. When electroless plating is employed, it is impossible to use conventionally used W as the material for the contact plug connected to the semiconductor substrate. For this reason, CoW or NiW is used, and thereby, electroless plating is applicable.

Incidentally, the method of manufacturing the semiconductor device shown in FIG. 1 is not limited to the foregoing embodiment. For example, the following process may be formed. More specifically, interlayer insulating films 11 and 21 may be formed, and thereafter, contact hole 12 and interconnect trench 22 may be formed. This process can be applied in the following second to fourth embodiments.

(Second Embodiment)

In the second embodiment, part of the contact hole is filled with the first conductive film 13, and the remainder is filled with the same material as the second conductive film 24 forming the interconnect layer.

Figure 5:
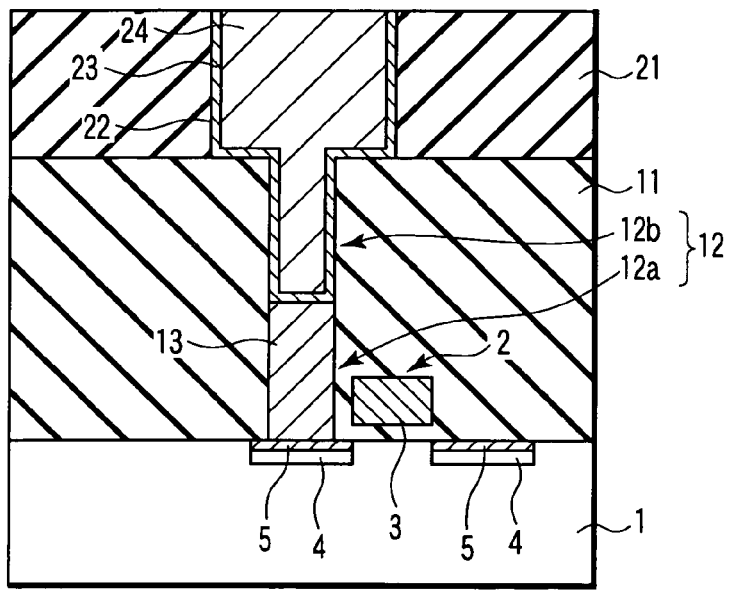
FIG. 5 is a view showing the cross-sectional structure of a semiconductor device according to a second embodiment of the present invention.

FIG. 5 is a view showing the cross-sectional structure of a semiconductor device according to a second embodiment of the present invention. As shown in FIG. 5, a contact hole 12 has a first region 12a, and a second region 12b. The first region 12a ranges from the bottom to the intermediate position, the second region 12b ranges from the upper portion of the first region 12a to the surface. The first conductive film 13 is formed in the first region 12a.

The barrier metal 23 covers the surface of the interlayer insulating film 11 in the second region 12b and the surface of first conductive film 13, in addition to the inner surface of the interconnect trench 22. The second conductive film 24 is buried in the interconnect trench 22 and the second region 12b via the barrier metal 23. Thus, the contact plug is composed of the first conductive film 13 and the same second conductive film 24 as the interconnect layer.

The height of the first region 12a is determined so that the aspect ratio of the second region 12b is set to 3.0 or less, preferably, in a range of 1.0 to 3.0. This is because the aspect ratio of the second region 12b needs to be determined so that both barrier metal 23 and second conductive film 24 can be formed in the second region 12b without defect.

The following is an explanation about why the aspect ratio of the second region 12b is determined as described above. If Cu is used as the second conductive film 24, the entirety of contact plug consists of Cu, and thereby, the resistance value is reduced. However, in this case, Cu molecules in the contact hole 12 via the thin barrier metal easily diffuse to other regions. The intrusion of Cu molecules to the semiconductor substrate 1 influences the transistor characteristic. This is not preferable in the contact plug connected directly to the semiconductor substrate 1. In addition, it is technically difficult to fill the contact hole having a high aspect ratio with copper. For this reason, the first conductive film 13 is formed in the first region 12a using electroless plating capable of preferably filling copper. Thus, the aspect ratio of the second region 12b is set to a range capable of preferably filling copper, that is, the maximum value (3). As a result, the contact plug is preferably formed; therefore, it has low resistance and has no influence on the transistor.

Figure 6:
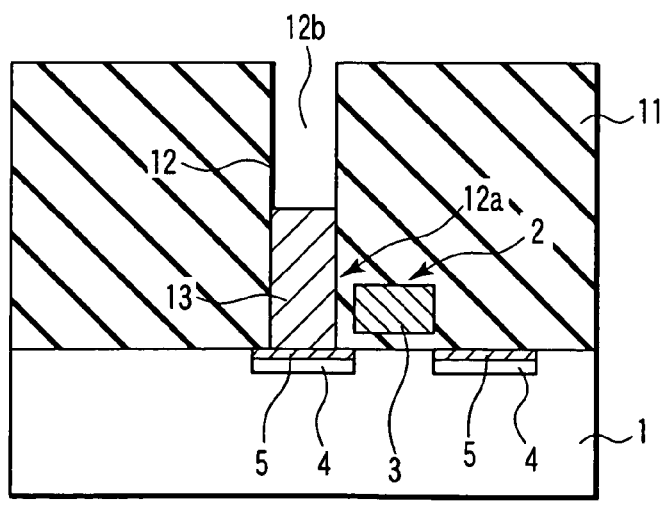
FIGS. 6 and 7 are views sequentially showing part of the process of manufacturing the semiconductor device shown in FIG. 5.

The method of manufacturing the semiconductor device shown in FIG. 5 will be described below with reference to FIG. 6 and FIG. 7. First, the same steps as the first embodiment are executed until the step shown in FIG. 2. As shown in FIG. 6, the interconnect insulating film 11 is formed on the semiconductor substrate 1, and the contact hole 12 is formed in the film 11 according to the same process as the first embodiment. The first region 12a of the contact hole 12 is filled with the first conductive film 13 by electroless plating.

Figure 7:
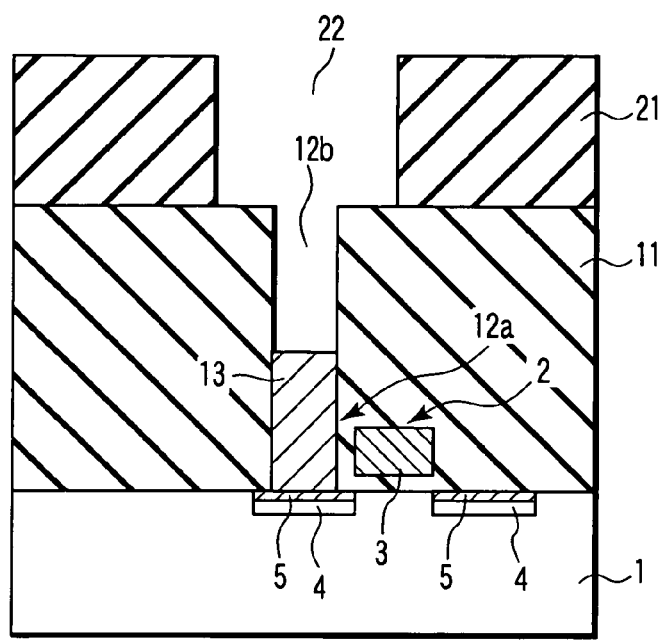

As illustrated in FIG. 7, the interlayer insulating film 21 is formed on the entire surface of the interlayer insulating film 11 by the CVD method. In this step, the second region 12b of the contact hole 12 is filled with the interlayer insulating film 21. The interconnect trench 22 is formed in the interlayer insulating film 21 by lithography and etching. In this step, the interlayer insulating film 21 filled in the second region 12b is removed.

As seen from FIG. 5, the upper surfaces of interlayer insulating films 11 and 21 in the interconnect trench 22, the film 11 of the second region 12b and the first conductive film 13 are coated with the barrier metal 23 by sputtering. Thereafter, the interconnect trench 22 and the second region 12b are filled with the second conductive film 24 using electroplating.

According to the second embodiment of the present invention, the semiconductor device has the following contact structure. The lower part (first region 12a) of the contact hole 12 is filled with alloy containing CoW or NiW. Thus, the same effect as the first embodiment is obtained in the first region 12a. In addition, the connecting portion with the semiconductor substrate 1, that is, the first region 12a is not filled with Cu. This serves to prevent Cu molecules from diffusing to the semiconductor substrate 1 in the heat treatment process.

According to the second embodiment, the upper part (second region 12b) of the contact hole 12 is filled with Cu. Thus, the resistance value of the contact plug is reduced. In addition, since the first region 12a is filled with the first conductive film 13, the aspect ratio of the portion filled with Cu is low. Therefore, the contact hole 12 is preferably formed.

(Third Embodiment)

In the third embodiment, the contact hole 12 is filled via the barrier metal, in addition to the structure described in the first embodiment.

Figure 8:
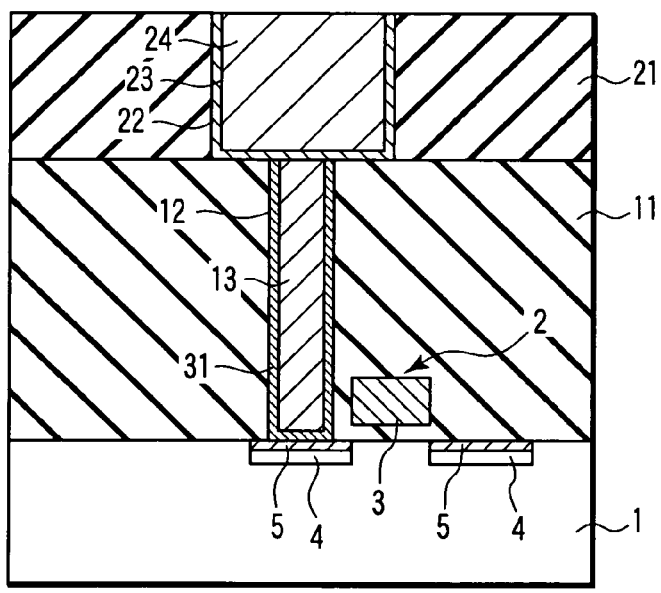
FIG. 8 is a view showing the cross-sectional structure of a semiconductor device according to a third embodiment of the present invention.

FIG. 8 is a view showing the cross-sectional structure of a semiconductor device according to a third embodiment of the present invention. As shown in FIG. 8, the interlayer insulating film 11 in the contact hole 12 and the silicide 5 are coated with barrier metal 31. Materials preventing the reaction of the first conductive film 13 with the silicide 5 are used as the barrier metal 31. More specifically, Ta, TaN, TiN, WN and TiSiN are given. Incidentally, the barrier metal 31 may be formed on only silicide 5. The contact hole 12 is filled with the first conductive film 13 via the barrier metal 31. The remaining structure is the same as in the first embodiment.

Figure 9:
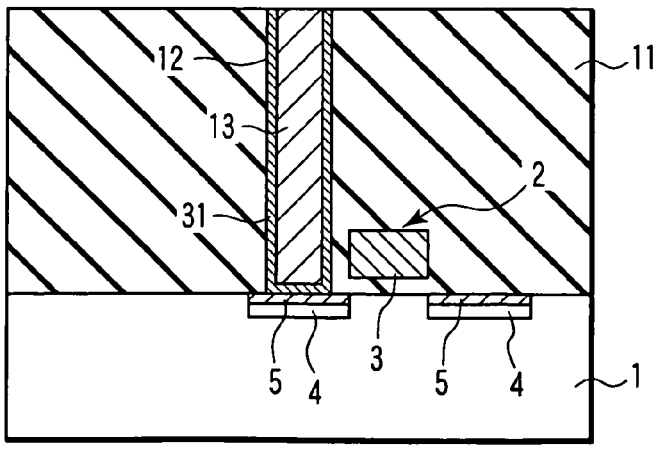
FIGS. 9 and 10 are views sequentially showing part of the process of manufacturing the semiconductor device shown in FIG. 8.

The method of manufacturing the semiconductor device shown in FIG. 8 will be described below with reference to FIG. 9 and FIG. 10. First, the same steps as the first embodiment are executed until the step shown in FIG. 2. As shown in FIG. 9, the interconnect insulating film 11 is formed on the semiconductor substrate 1, and the contact hole 12 is formed in the film 11 according to the same process as the first embodiment. The barrier metal 31 is formed on the inner surface of the contact hole 12 by sputtering. Thereafter, the contact hole 12 is filled with the first conductive film 13 according to the same process as the first embodiment.

Figure 10:
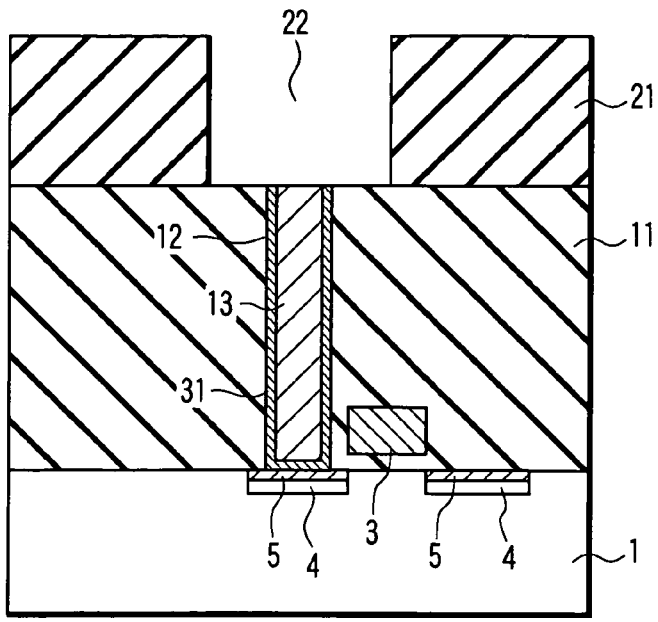

As illustrated in FIG. 10, the interlayer insulating film 21 is formed on the film 11, and thereafter, the interconnect trench 22 is formed therein according to the same process as the first embodiment. As seen from FIG. 8, the interconnect trench 22 is filled with the second conductive film 24 via the barrier metal 23.

According to the third embodiment of the present invention, the semiconductor device can obtain the same effect as the first embodiment. In addition, according to the third embodiment, the barrier metal 31 is interposed between the silicide 5 and the first conductive film 13. Therefore, it is possible to prevent the silicide 5 with the first conductive film 13 from reacting with each other.

(Fourth Embodiment)

In the fourth embodiment, the contact hole 12 is filled via the barrier metal, in addition to the structure described in the second embodiment.

Figure 11:
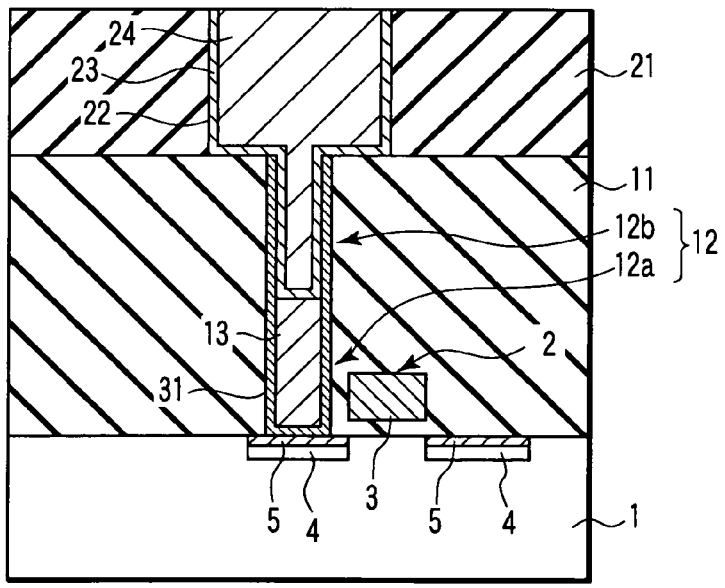
FIG. 11 is a view showing the cross-sectional structure of a semiconductor device according to a fourth embodiment of the present invention.

FIG. 11 is a view showing the cross-sectional structure of a semiconductor device according to a fourth embodiment of the present invention. As shown in FIG. 11, the interlayer insulating film 11 in the contact hole 12 and the silicide 5 are coated with the barrier metal 31. In this case, the barrier metal 31 may be formed on only the silicide 5. The first region 12a of the contact hole 12 is filled with the first conductive film 13 via the barrier metal 31. The second region 12b is filled with the second conductive film 24 via barrier metals 31 and 23. The remaining structure is the same as in the second embodiment.

Figure 12:
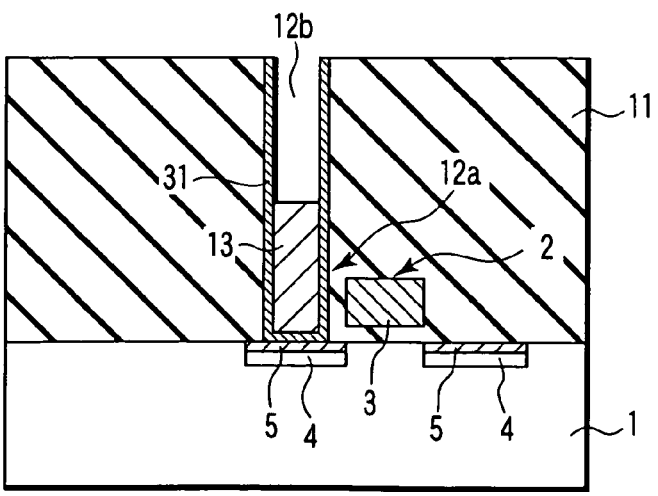
Figure 14:
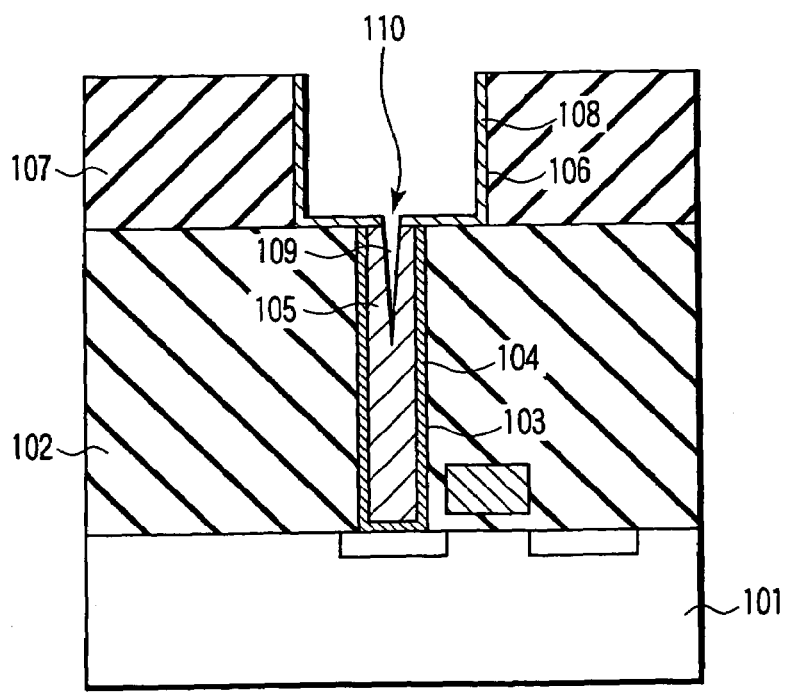
FIG. 14 is a view showing the cross-sectional structure of a conventional semiconductor device.

The method of manufacturing the semiconductor device shown in FIG. 11 will be described below with reference to FIG. 12 and FIG. 13. First, the same steps as the first embodiment are executed until the step shown in FIG. 2. As shown in FIG. 12, the interconnect insulating film 11 is formed on the semiconductor substrate 1, and the contact hole 12 is formed in the interconnect insulating film 11 according to the same process as the first embodiment. The barrier metal 31 is formed on the inner surface of the contact hole 12 by sputtering. Thereafter, the first region 12a is filled with the first conductive film 13 according to the same process as the second embodiment.

As illustrated in FIG. 13, the interlayer insulating film 21 is formed on the interconnect insulating film 11, and thereafter, the interconnect trench 22 is formed therein according to the same process as the first embodiment. As seen from FIG. 11, the interconnect trench 22 and the second region 12b are filled with the second conductive film 24 via the barrier metal 23 according to the same process as the second embodiment According to the fourth embodiment of the present invention, the semiconductor device can obtain the same effect as the first embodiment. In addition, according to the fourth embodiment, the barrier metal is interposed between the silicide 5 and the first conductive film 13. Therefore, it is possible to prevent the silicide 5 with the first conductive film 13 from reacting with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an active element structure formed on the semiconductor substrate, and having a connection region formed in a surface of the semiconductor substrate;
   an insulating film formed on the semiconductor substrate;
   a connection hole formed in the insulating film, having a bottom connected with the connection region, and including a first region and a second region formed over the first region;
   an interconnect trench formed in the insulating film, and having a bottom connected with the connection hole;
   a first conductive film filled in the first region of the connection hole, and consisting of an alloy containing CoW or NiW;
   a second conductive film filled in the interconnect trench and the second region of the connection hole, and contacting with the first conductive film; and
   a first diffusion prevention film formed between an inner surface of the interconnect trench and the second conductive film, between a side surface of the connection hole in the second region and the second conductive film and on the first conductive film.

2. The device according to claim 1, wherein the first conductive film has a side common to the insulating film in the connection hole.

3. The device according to claim 1, wherein the aspect ratio of the second region is 1.0 to 3.0.

4. The device according to claim 1, further comprising:
   a second diffusion prevention film formed between a side surface of the connection hole in the first region and the first conductive film and between the side surface of the connection hole in the second region and the first diffusion prevention film.

5. The device according to claim 4, further comprising:
   a silicide formed on the surface of the connection region.

6. The device according to claim 5, wherein the second diffusion prevention film is composed of a material selected from a group consisting of Ta, TaN, TiN, WN and TiSiN.

7. The device according to claim 1, wherein the first conductive film further contains group III or V elements.

8. A method of manufacturing a semiconductor device, comprising:
   forming an active element structure having a connection region formed on a surface of a semiconductor substrate, on the semiconductor substrate;
   forming a first insulating film having a connection hole whose bottom is connected with the connection region, on the semiconductor substrate;
   filling a first region ranging from the connection region in the connection hole to a first height with a first conductive film composed of an alloy containing CoW or NiW by electroless plating;
   forming a second insulating film having an interconnect trench whose bottom is connected with the connection hole, on the first insulating film; and
   filling the interconnect trench and a second region excepting the first region of the connection hole with a second conductive film.

9. The method according to claim 8, wherein the first conductive film is composed of an alloy containing group III or V elements and containing CoW or NiW.

10. The method according to claim 8, wherein forming the second insulating film includes:
  forming the second insulating film on the first insulating film and in the second region; and
  forming the interconnect trench in the second insulating film while removing the second insulating film of the second region.

11. The method according to claim 8, further comprising:
  forming a first diffusion prevention film on a side surface of the connection hole and on the connection region before the first conductive film is filled.

12. The method according to claim 11, further comprising:
  forming a second diffusion prevention film on an inner surface of the interconnect trench, on a side surface of the connection hole in the first region, and on the first conductive film before the second conductive film is filled.

13. The device according to claim 4, wherein the first conductive film further contains group III or V elements.

\* \* \* \* \*